United States Patent
Kanatani et al.

(10) Patent No.: US 11,977,101 B2
(45) Date of Patent: May 7, 2024

(54) STATE DETECTION APPARATUS

(71) Applicant: YOKOGAWA ELECTRIC CORPORATION, Tokyo (JP)

(72) Inventors: Nobuhiro Kanatani, Musashino (JP); Takayuki Suzuki, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 8 days.

(21) Appl. No.: 17/654,334

(22) Filed: Mar. 10, 2022

(65) Prior Publication Data
US 2022/0308096 A1   Sep. 29, 2022

(30) Foreign Application Priority Data

Mar. 26, 2021  (JP) .................................. 2021-054212

(51) Int. Cl.
| G01R 15/22 | (2006.01) |
| G01R 19/15 | (2006.01) |
| H01M 10/42 | (2006.01) |
| H01M 10/48 | (2006.01) |
| H02J 7/00  | (2006.01) |

(52) U.S. Cl.
CPC ............. *G01R 15/22* (2013.01); *G01R 19/15* (2013.01); *H01M 10/425* (2013.01); *H01M 10/48* (2013.01); *H02J 7/0063* (2013.01); *H01M 2010/4271* (2013.01)

(58) Field of Classification Search
None
See application file for complete search history.

(56) References Cited

U.S. PATENT DOCUMENTS

| 2014/0191764 A1* | 7/2014 | Kawano ............... G01R 31/389 324/430 |
| 2015/0184772 A1* | 7/2015 | Inagaki ................... F16K 31/14 251/30.01 |
| 2016/0061908 A1* | 3/2016 | Torai ................... G01R 31/3648 702/63 |
| 2016/0156290 A1* | 6/2016 | Xu ........................... H02P 6/12 318/400.21 |
| 2016/0336742 A1* | 11/2016 | Saito ................... F16K 31/0675 |

FOREIGN PATENT DOCUMENTS

JP          2015-222085 A     12/2015

\* cited by examiner

*Primary Examiner* — Jay Patidar
*Assistant Examiner* — Haidong Zhang
(74) *Attorney, Agent, or Firm* — RANKIN, HILL & CLARK LLP

(57) ABSTRACT

A state detection apparatus includes a communication circuit that transmits information to an external apparatus, a control circuit that operates the communication circuit at a first timing, a battery that supplies electric power to the communication and control circuits, and a first explosion-proof barrier connected between a contact circuit and the control circuit. The control circuit applies a test signal, generated based on voltage from the battery, to the contact circuit at a second timing arriving at shorter intervals than the first timing, acquires a detection signal indicating current flow in the contact circuit due to test signal application, and regardless of the first timing, operates the communication circuit when the detection signal is acquired to transmit to the external apparatus that the state of a device connected to the contact circuit is abnormal.

14 Claims, 5 Drawing Sheets

STATE DETECTION APPARATUS

CROSS REFERENCE TO RELATED APPLICATION

This application claims priority to and the benefit of Japanese Patent Application No. 2021-54212 (filed on Mar. 26, 2021), the entire contents of which are incorporated herein by reference.

TECHNICAL FIELD

The present disclosure relates to a state detection apparatus.

BACKGROUND

Explosion-proof barriers that limit the voltage and current of the operating power supply of a solenoid-type valve in a contact signal converter that converts an on-off contact signal into a control signal for operating the solenoid-type valve are known. See, for example, patent literature (PTL) 1.

CITATION LIST

Patent Literature

PTL 1: JP 2015-222085 A

SUMMARY

A state detection apparatus according to an embodiment includes a communication circuit, a control circuit, a battery, and a first explosion-proof barrier. The communication circuit transmits information to an external apparatus. The control circuit operates the communication circuit at a first timing. The battery supplies electric power to the communication circuit and the control circuit. The first explosion-proof barrier is connected between the contact circuit and the control circuit. The control circuit applies a test signal, generated based on a voltage outputted by the battery, to the contact circuit via the first explosion-proof barrier at a second timing that arrives at a shorter interval than the first timing. The control circuit acquires, from the first explosion-proof barrier, a detection signal indicating that a current has flowed in the contact circuit due to application of the test signal to the contact circuit. Regardless of the first timing, the control circuit operates the communication circuit at a timing at which the detection signal is acquired to transmit to the external apparatus that a state of a device connected to the contact circuit is an abnormal state.

DETAILED DESCRIPTION

Figure 1:
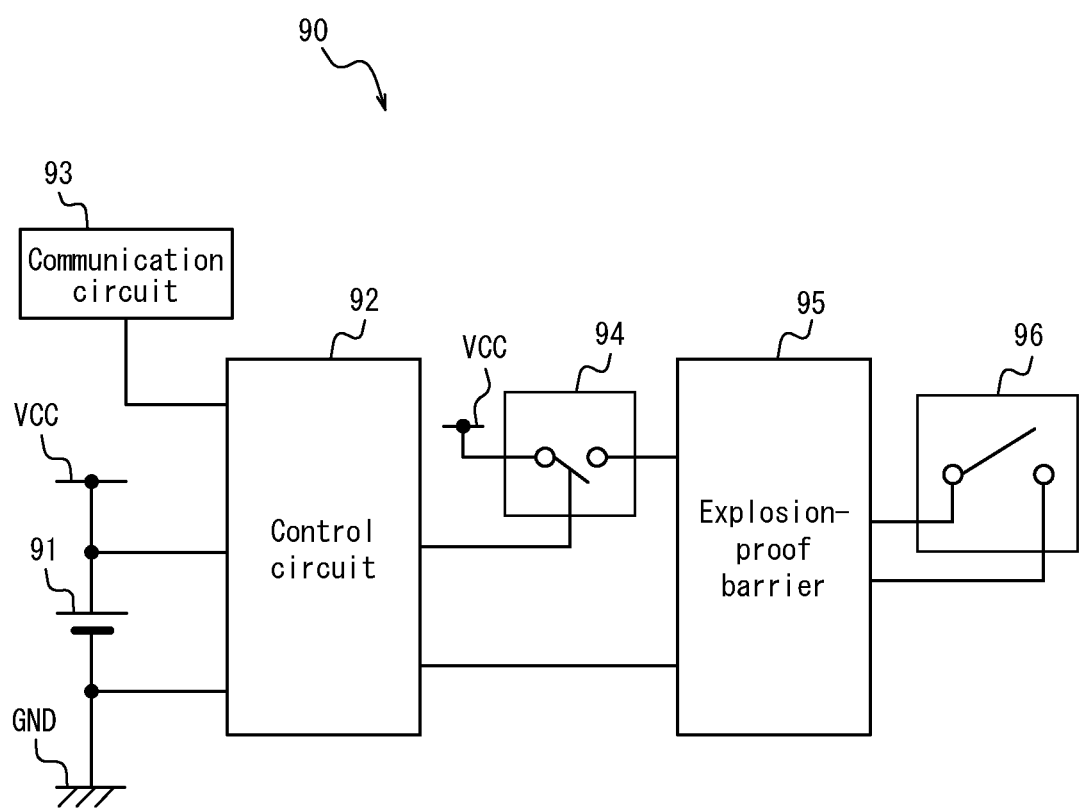
FIG. 1 is a circuit diagram of a state detection apparatus according to a comparative example.

A contact circuit and a state detection apparatus that detects an abnormal state of the contact circuit may be connected via an explosion-proof barrier. When the state detection apparatus transmits the detection result to other devices upon detecting an abnormal state of the contact circuit, it is required that the time between the detection of the abnormal state and the transmission of the detection result be shortened, and also that the power consumption of the communication circuit be reduced. It would be helpful to provide a state detection apparatus that can both shorten the time between detection of an abnormal state and transmission of the detection result and reduce the power consumption of the communication circuit.

A state detection apparatus according to an embodiment includes a communication circuit, a control circuit, a battery, and a first explosion-proof barrier. The communication circuit transmits information to an external apparatus. The control circuit operates the communication circuit at a first timing. The battery supplies electric power to the communication circuit and the control circuit. The first explosion-proof barrier is connected between the contact circuit and the control circuit. The control circuit applies a test signal, generated based on a voltage outputted by the battery, to the contact circuit via the first explosion-proof barrier at a second timing that arrives at a shorter interval than the first timing. The control circuit acquires, from the first explosion-proof barrier, a detection signal indicating that a current has flowed in the contact circuit due to application of the test signal to the contact circuit. Regardless of the first timing, the control circuit operates the communication circuit at a timing at which the detection signal is acquired to transmit to the external apparatus that a state of a device connected to the contact circuit is an abnormal state. With this configuration, the time taken from when the control circuit detects the abnormal state of the contact circuit until the control circuit transmits the detection of the abnormal state to the external apparatus is reduced, regardless of the timing of the detection of the abnormal state of the contact circuit. Furthermore, the time taken from when the control circuit detects the abnormal state of the contact circuit until the control circuit transmits the detection of the abnormal state to the external apparatus is shortened without shortening the interval of the first timing for operating the communication circuit. By the interval of the first timing for operating the communication circuit not being shortened, the power consumption of the communication circuit is reduced. As a result, both the shortening of the time taken from the detection of the abnormal state of the contact circuit by the control circuit to the transmission of the information indicating detection of the abnormal state and the reduction in power consumption of the communication circuit are achieved.

A state detection apparatus according to an embodiment may further include a latch circuit configured to acquire and hold the detection signal. The control circuit may acquire the detection signal from the latch circuit. With this configuration, the control circuit can acquire the detection signal at a timing determined by the control circuit itself. Consequently, the load on the control circuit can be reduced.

In a state detection apparatus according to an embodiment, the control circuit may acquire the detection signal from the latch circuit at a third timing that arrives at a shorter interval than the first timing. With this configuration, the time taken from when the control circuit detects the abnormal state of the contact circuit until the control circuit transmits the detection of the abnormal state to the external apparatus is shortened without shortening the interval of the first timing for operating the communication circuit. As a result, both the shortening of the time taken from the detection of the abnormal state of the contact circuit by the control circuit to the transmission of the information indicating detection of the abnormal state and the reduction in power consumption of the communication circuit are achieved.

In a state detection apparatus according to an embodiment, the control circuit may operate the communication circuit as an interrupt process upon acquiring the detection signal to transmit to the external apparatus that the state of the device connected to the contact circuit is the abnormal state. With this configuration, the time taken from when the control circuit detects the abnormal state of the contact circuit until the control circuit transmits the detection of the abnormal state to the external apparatus is shortened without shortening the interval of the first timing for operating the communication circuit. As a result, both the shortening of the time taken from the detection of the abnormal state of the contact circuit by the control circuit to the transmission of the information indicating detection of the abnormal state and the reduction in power consumption of the communication circuit are achieved.

In a state detection apparatus according to an embodiment, the battery may be a lithium thionyl chloride primary battery. In this way, the state detection apparatus can operate for an extended period of time with a large amount of electric power supplied from the battery. As a result, the state detection apparatus can be used in the field, such as in processing plants and factories, where stable operation for an extended period of time is required.

In a state detection apparatus according to an embodiment, the control circuit may, at the second timing, cause the battery to output a current equal to or greater than a current value based on specifications of the lithium thionyl chloride primary battery. With this configuration, the signal is outputted to the contact circuit in conjunction with an operation to reduce the internal resistance of the battery.

A state detection apparatus according to an embodiment may further include a step-up circuit connected between the first explosion-proof barrier and the contact circuit, and a second explosion-proof barrier connected between the step-up circuit and the contact circuit. The step-up circuit may step up the voltage outputted by the battery to generate a step-up signal and may apply the step-up signal as the test signal to the contact circuit via the second explosion-proof barrier. With this configuration, even if the power outputted from the battery is limited by the first explosion-proof barrier, the voltage inputted to the contact circuit can be stepped up to a level that sufficiently detects the state of the device connected to the contact circuit. Consequently, the state detection apparatus can detect the state of the device connected to the contact circuit.

According to the state detection apparatus of the present disclosure, both a reduction in the time from detection of an abnormal state to transmission of the detection result and a reduction in the power consumption of the communication circuit can be achieved.

Embodiments of the present disclosure are described while being compared to a comparative example.

Comparative Example

As illustrated in FIG. 1, a state detection apparatus 90 according to a comparative example includes a battery 91, a control circuit 92, a communication circuit 93, a switch 94, and an explosion-proof barrier 95. The state detection apparatus 90 is connected to a contact circuit 96 via the explosion-proof barrier 95. The contact circuit 96 is connected to another device. The device connected to the contact circuit 96 is also referred to as the connected device. The state detection apparatus 90 can detect the state of the device connected to the contact circuit 96 by acquiring a signal corresponding to the state of the device connected to the contact circuit 96. When the contact circuit 96 is in the open state (open), the state of the device connected to the contact circuit 96 is assumed to be normal. When the contact circuit 96 is in the closed state (conducting state), the state of the device connected to the contact circuit 96 is assumed to be abnormal.

The battery 91 supplies electric power to the control circuit 92 and the communication circuit 93. The battery 91 is connected between a ground point, represented by GND, and a feed point, represented by VCC, and applies voltage to the feed point. The control circuit 92 controls the operation of the communication circuit 93.

The control circuit 92 controls the switch 94 to be either open or closed. When the switch 94 is closed, the voltage applied from the battery 91 to the feed point is outputted to the contact circuit 96 via the explosion-proof barrier 95.

When a voltage is applied to the contact circuit 96 via the explosion-proof barrier 95, a current corresponding to the state of the device connected to the contact circuit 96 flows in the contact circuit 96. The explosion-proof barrier 95 outputs a signal based on the detection result of the current flowing in the contact circuit 96 as a detection signal to the control circuit 92. Specifically, when the contact circuit 96 is closed, i.e., when the state of the device connected to the contact circuit 96 is abnormal, the explosion-proof barrier 95 detects the flow of current in the contact circuit 96. The explosion-proof barrier 95 outputs a signal indicating that a current has flowed in the contact circuit 96 as a detection signal. On the other hand, when the contact circuit 96 is open, i.e., when the state of the device connected to the contact circuit 96 is normal, the explosion-proof barrier 95 detects that no current has flowed in the contact circuit 96. In the case of detecting that no current has flowed in the contact circuit 96, the explosion-proof barrier 95 does not output a detection signal.

In the case in which the control circuit 92 acquires a detection signal, which is a signal corresponding to the state of the device connected to the contact circuit 96, from the explosion-proof barrier 95 when the switch 94 is closed, the control circuit 92 determines that the state of the device connected to the contact circuit 96 is abnormal based on the detection signal. In the case in which the control circuit 92 does not acquire a detection signal, which is a signal corresponding to the state of the device connected to the contact circuit 96, from the explosion-proof barrier 95 when the switch 94 is closed, the control circuit 92 determines that the state of the device connected to the contact circuit 96 is normal based on the non-acquisition of the detection signal.

In the case of determining that the state of the device connected to the contact circuit 96 is abnormal, the control circuit 92 uses the communication circuit 93 to transmit, to an external apparatus, an indication that the state of the device connected to the contact circuit 96 is abnormal.

Here, to reduce the power consumption of the communication circuit 93 and delay the draining of the battery 91, the control circuit 92 controls the communication circuit 93 to be in a non-operating state, such as suspended or asleep, as a general rule and controls the communication circuit 93 to operate in a first cycle.

For frequent checking of the state of the device connected to the contact circuit 96 while delaying the draining of the battery 91, the control circuit 92 controls the switch 94 to be open as a general rule and controls the switch 94 to be closed in the first cycle and in a second cycle that is shorter than the first cycle.

Figure 2:
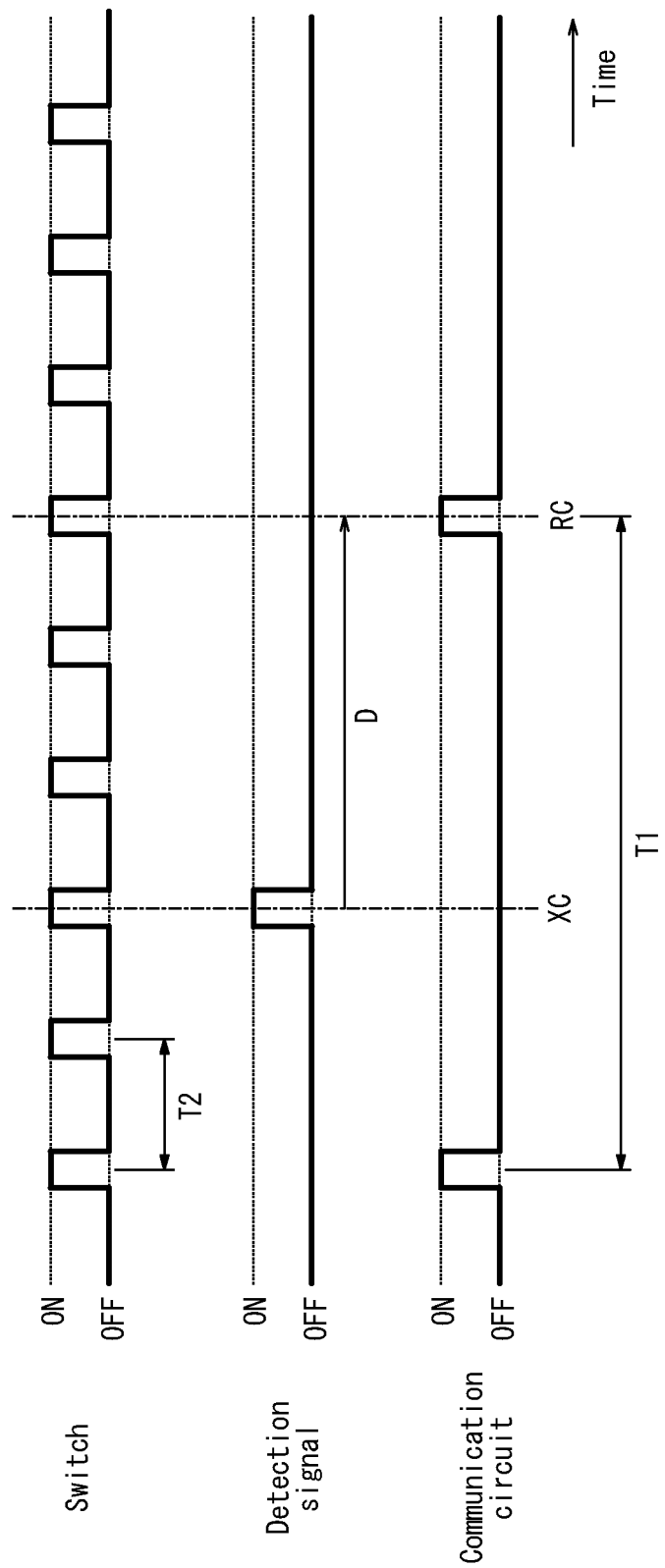
FIG. 2 is a diagram illustrating the timing of operation of the state detection apparatus according to a comparative example.

The operating condition of the communication circuit 93 and the state of the switch 94 are illustrated as a timing chart in FIG. 2 for the case in which the control circuit 92 controls the communication circuit 93 and the switch 94 in the first and second cycles. In FIG. 2, the horizontal axis represents the passage of time. In the row for the switch 94, two dashed lines corresponding to the state of the switch 94 being "ON" or "OFF" are depicted. The solid line superimposed on the dashed lines represents which of the two states, "ON" or "OFF", the state of the switch 94 changes to as time passes. In the period in which the solid line is superimposed on the dashed line on the "ON" side, the switch 94 is closed. In the period in which the solid line is superimposed on the dashed line on the "OFF" side, the switch 94 is open. The second cycle over which the control circuit 92 controls the state of the switch 94 to be "ON" is represented by T2.

In the row for the communication circuit 93, two dashed lines corresponding to the operating condition of the communication circuit 93 being "ON" or "OFF" are depicted. The solid line superimposed on the dashed lines represents which of the two operating conditions, "ON" or "OFF", the operating condition of the communication circuit 93 changes to as time passes. In the period in which the solid line is superimposed on the dashed line on the "ON" side, the communication circuit 93 is operating. In the period in which the solid line is superimposed on the dashed line on the "OFF" side, the communication circuit 93 is not operating. The first cycle over which the control circuit 92 operates the communication circuit 93 is represented by T1.

As described above, the control circuit 92 can acquire a detection signal from the explosion-proof barrier 95 when a current flows in the contact circuit 96 due to closing of the switch 94. Upon acquiring the detection signal, the control circuit 92 can confirm that the state of the device connected to the contact circuit 96 is abnormal. An example of a detection signal is illustrated in the timing chart in FIG. 2. In the row for the detection signal, two dashed lines corresponding to the state of the detection signal being "ON" or "OFF" are depicted. The solid line superimposed on the dashed lines represents which of the two states, "ON" or "OFF", the detection signal changes to as time passes. In the period in which the solid line is superimposed on the dashed line on the "ON" side, the detection signal is being outputted from the explosion-proof barrier 95. In the period in which the solid line is superimposed on the dashed line on the "OFF" side, the detection signal is not being outputted from the explosion-proof barrier 95.

Here, in the timing chart of FIG. 2, the control circuit 92 detects that the state of the detection signal is "ON" at the timing represented as XC by a vertical dashed dotted line, i.e., that the detection signal has been outputted from the explosion-proof barrier 95. Based on the state of the detection signal having changed to "ON", the control circuit 92 determines that the state of the device connected to the contact circuit 96 is abnormal. After determining that the state of the device connected to the contact circuit 96 is abnormal, the control circuit 92 operates the communication circuit 93 at the timing that arrives next in the first cycle, represented as RC by a vertical dashed dotted line, and uses the communication circuit 93 to transmit to an external apparatus an indication that the state of the device connected to the contact circuit 96 is abnormal.

As a result of the control circuit 92 operating the communication circuit 93 in the first cycle, the time taken from when the control circuit 92 detects the abnormal state of the contact circuit 96 until the control circuit 92 transmits the detection of the abnormal state to the external apparatus depends on the timing of the detection of the abnormal state of the contact circuit 96. The time taken from the detection to transmission of the abnormal state of the contact circuit 96 by the control circuit 92 is also referred to as the delay time and is represented by D in FIG. 2.

The control circuit 92 may shorten the first cycle to shorten the delay time regardless of the timing of the detection of the abnormal state of the device connected to the contact circuit 96. However, shortening the first cycle increases the operation frequency of the communication circuit 93, which consumes a large amount of power, and causes an increase in the power consumption of the state detection apparatus 90 as a whole. Consequently, the battery 91 will be drained faster.

As described above, the state detection apparatus 90 according to the comparative example is problematic since it is difficult to shorten the delay time from detection to transmission of the abnormal state of the contact circuit 96 while delaying the draining of the battery 91 by lengthening the operation cycle of the communication circuit 93.

Figure 3:
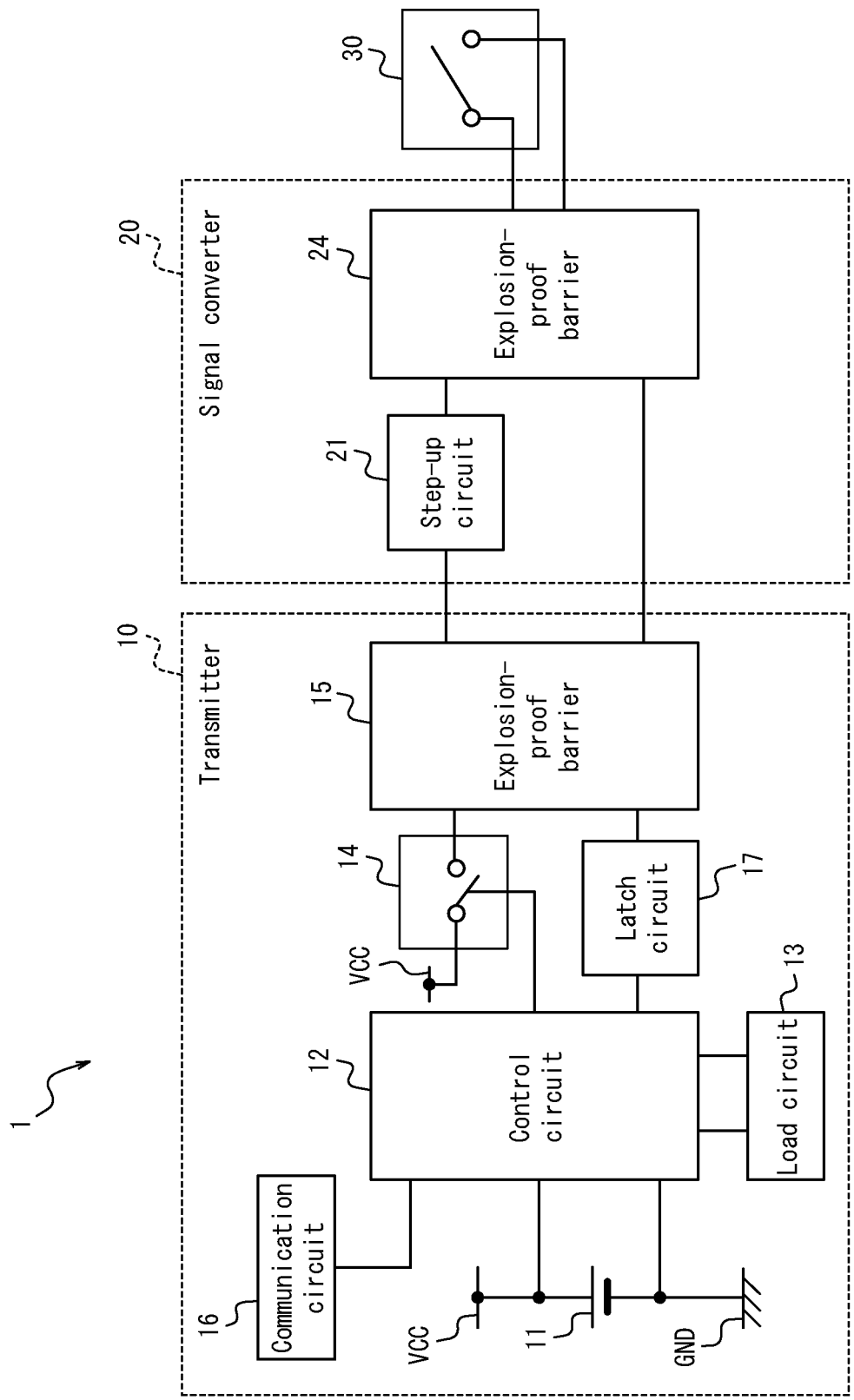
FIG. 3 is a circuit diagram illustrating an example configuration of a state detection apparatus according to an embodiment.

The present disclosure therefore describes a state detection apparatus 1 (see FIG. 3) that can reduce the delay time from detection to transmission of an abnormal state of a contact circuit 30 (see FIG. 3) while delaying the draining of a battery 11 (see FIG. 3). The state detection apparatus 1 may be applied to edge computer gateways. The state detection apparatus 1 may also be used in a gateway terminal for the Internet of Things (IoT).

Embodiment of the Present Disclosure

As illustrated in FIG. 3, the state detection apparatus 1 according to an embodiment includes a transmitter 10 and a signal converter 20. The transmitter 10 incudes a battery 11, a control circuit 12, a switch 14, an explosion-proof barrier 15, a communication circuit 16, and a latch circuit 17. The signal converter 20 includes a step-up circuit 21 and an explosion-proof barrier 24. The state detection apparatus 1 is connected to a contact circuit 30 via the explosion-proof barrier 24 of the signal converter 20. In other words, the explosion-proof barrier 24 is connected between the signal converter 20 and the contact circuit 30. The explosion-proof barrier 15 is connected between the control circuit 12 and the contact circuit 30. The explosion-proof barrier 15 is also referred to as the first explosion-proof barrier. The explosion-proof barrier 24 is also referred to as the second explosion-proof barrier.

Figure 4:
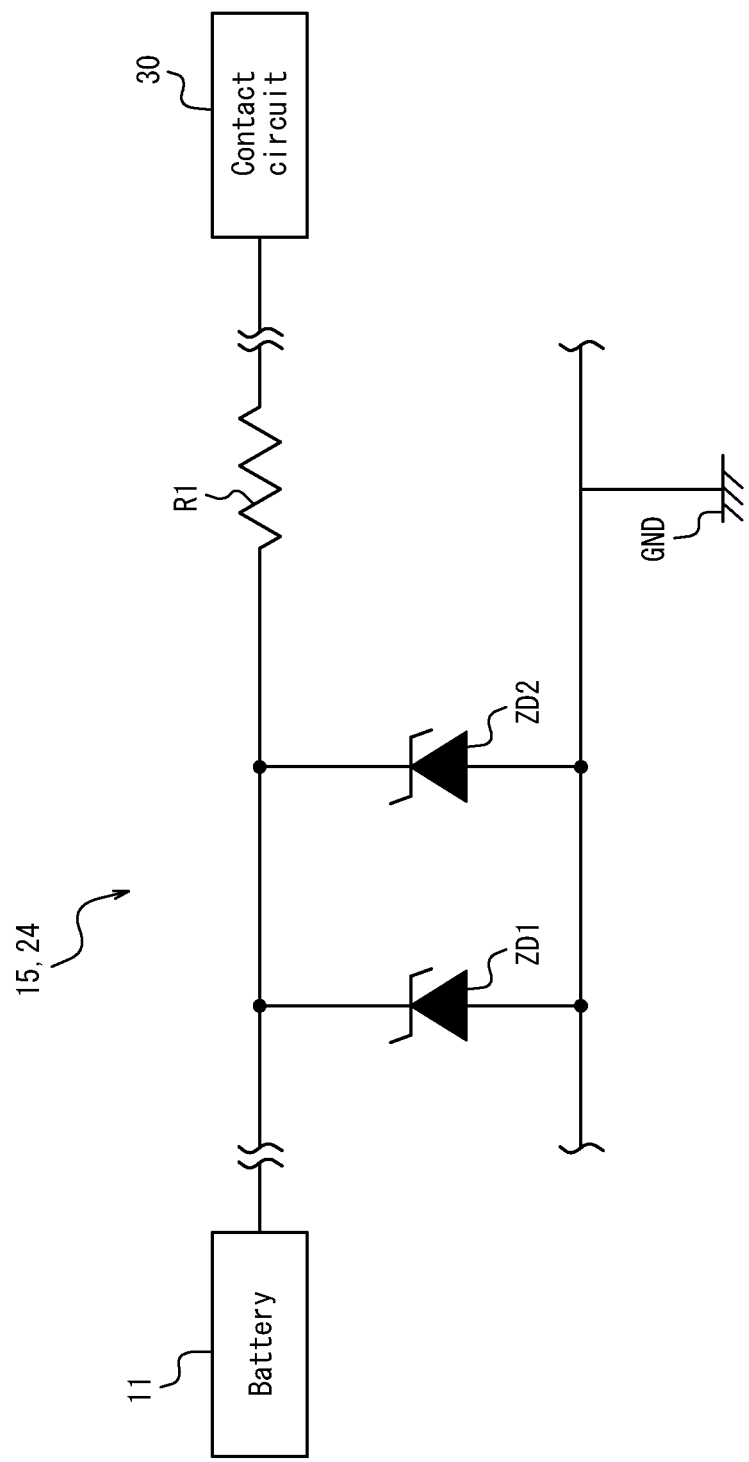
FIG. 4 is a circuit diagram illustrating an example configuration of an explosion-proof barrier.

The explosion-proof barrier 15 or 24 includes Zener diodes ZD1 and ZD2 connected in parallel between a signal line L1 and a ground line L2, and a resistor R1 is connected in series with the signal line L1, as illustrated in FIG. 4, for example. The signal line L1 connects the battery 11 and the contact circuit 30. The resistor R1 is connected in series on the side connected to the contact circuit 30. The explosion-proof barrier 24 further includes a current detection circuit that detects the current flowing in the contact circuit 30. The current detection circuit may, for example, include a light emitting diode that emits light when a current flows in the contact circuit 30 and a light detecting element that detects the emission of the light emitting diode. The light detecting element outputs a signal indicating detection of light emission when a current flows in the contact circuit 30. The signal indicating detection of light emission corresponds to a signal indicating that a current has flowed in the contact circuit 30.

The Zener diodes ZD1, ZD2 limit the voltage applied to the signal line L1. The Zener diode ZD1 or ZD2 may be configured by a plurality of Zener diodes connected in series. The signal propagates from the battery 11 towards the contact circuit 30. As a result of the resistor R1 being connected downstream in the signal propagation direction of the signal line L1, the voltage outputted by the explosion-proof barrier 15 or 24 is limited by the maximum voltage applied to the Zener diodes ZD1, ZD2.

The resistor R1 limits the current outputted from the explosion-proof barrier 15 or 24. The resistance of the resistor R1 is determined based on the upper limit of the voltage determined by the Zener diodes ZD1, ZD2 and the upper limit of the current to be determined by the resistor R1.

The state detection apparatus 1 outputs a test signal, generated based on the voltage outputted by the battery 11, to the contact circuit 30 from the battery 11 of the transmitter 10 via the switch 14, the explosion-proof barrier 15, the step-up circuit 21, and the explosion-proof barrier 24. The contact circuit 30 is connected to another device. The device connected to the contact circuit 30 is also referred to as the connected device. When the test signal is applied to the contact circuit 30 from the state detection apparatus 1, a current flows in the contact circuit 30 according to the state of the device connected to the contact circuit 30. When the contact circuit 30 is in the open state (open), the state of the device connected to the contact circuit 30 is assumed to be normal. When the contact circuit 30 is in the closed state (conducting state), the state of the device connected to the contact circuit 30 is assumed to be abnormal. When detecting that a current has flowed in the contact circuit 30, the explosion-proof barrier 24 of the signal converter 20 outputs a signal indicating that a current has flowed in the contact circuit 30. The signal indicating that a current has flowed in the contact circuit 30 is also referred to as a detection signal. The transmitter 10 of the state detection apparatus 1 acquires the detection signal from the explosion-proof barrier 24 and can thereby detect that the state of the device connected to the contact circuit 30 is abnormal.

The battery 11 supplies electric power to the control circuit 12 and the communication circuit 16. The battery 11 is connected between a ground point, represented by GND, and a feed point, represented by VCC, and applies voltage to the feed point. The control circuit 12 controls the operation of the communication circuit 16.

The control circuit 12 controls the switch 14 to be either open or closed. When the switch 14 is closed, the voltage applied from the battery 11 to the feed point is outputted to the signal converter 20 via the explosion-proof barrier 15.

The step-up circuit 21 of the signal converter 20 outputs a step-up signal, yielded by stepping up the voltage applied from the battery 11 via the switch 14 and the explosion-proof barrier 15, as a test signal to the contact circuit 30 via the explosion-proof barrier 24. The step-up circuit 21 may be configured as a chopper circuit that includes a capacitor, inductor, or the like, to step up the voltage outputted by the battery 11. Although the power inputted to the step-up circuit 21 from the transmitter 10 is limited by the explosion-proof barrier 15, the voltage inputted to the contact circuit 30 can be stepped up enough to detect the state of the device connected to the contact circuit 30 by a large-capacity capacitor or inductor being mounted in the step-up circuit 21.

When a step-up signal is inputted to the contact circuit 30 from the explosion-proof barrier 24 of the signal converter 20, a current corresponding to the state of the device connected to the contact circuit 30 flows in the contact circuit 30. The explosion-proof barrier 24 outputs a detection signal based on the detection result of the current flowing in the contact circuit 30 to the transmitter 10. Specifically, when the contact circuit 30 is closed, i.e., when the state of the device connected to the contact circuit 30 is abnormal, the explosion-proof barrier 24 detects the flow of current in the contact circuit 30. The explosion-proof barrier 24 outputs a detection signal to the transmitter 10 indicating that a current has flowed in the contact circuit 30. The voltage of the detection signal may be the same as or lower than the voltage of the step-up signal. In other words, the voltage of the detection signal may be equal to or less than the voltage of the step-up signal. On the other hand, when the contact circuit 30 is open, i.e., when the state of the device connected to the contact circuit 30 is normal, the explosion-proof barrier 24 detects that no current has flowed in the contact circuit 30. In the case of detecting that no current has flowed in the contact circuit 30, the explosion-proof barrier 24 does not output a detection signal to the transmitter 10.

When the explosion-proof barrier 24 of the signal converter 20 outputs the detection signal to the transmitter 10, the detection signal is inputted to the latch circuit 17 via the explosion-proof barrier 15 of the transmitter 10. The latch circuit 17 holds the inputted detection signal. The control circuit 12 acquires the detection signal held in the latch circuit 17. The control circuit 12 may accept the input of the detection signal from the latch circuit 17 when the latch circuit 17 holds the detection signal. The control circuit 12 may acquire the detection signal from the latch circuit 17 at a timing determined by the control circuit 12 itself after the latch circuit 17 holds the detection signal. The control circuit 12 may, for example, acquire the detection signal from the latch circuit 17 at the next timing for controlling the switch 14 to be closed.

In a case in which the detection signal is acquired, the control circuit 12 can determine that the state of the device connected to the contact circuit 30 is abnormal. In a case in which the detection signal is not acquired, the control circuit 12 can determine that the state of the device connected to the contact circuit 30 is normal. In other words, the control circuit 12 can determine that the state of the device connected to the contact circuit 30 is abnormal in the case in which the detection signal, which is a signal corresponding to the state of the device connected to the contact circuit 30, is acquired when the switch 14 is closed.

In the case of determining that the state of the device connected to the contact circuit 30 is abnormal, the control circuit 12 uses the communication circuit 16 to transmit, to an external apparatus, an indication that the state of the device connected to the contact circuit 30 is abnormal.

Here, to reduce the power consumption of the communication circuit 16 and delay the draining of the battery 11, the control circuit 12 controls the communication circuit 16 to be in a non-operating state, such as suspended or asleep, as a general rule and controls the communication circuit 16 to operate at a first timing. The first timing may be a timing that arrives periodically or at irregular intervals. In the present embodiment, the first timing arrives in a first cycle.

For frequent checking of the state of the device connected to the contact circuit 30 while delaying the draining of the battery 11, the control circuit 12 controls the switch 14 to be open as a general rule and controls the switch 14 to be closed at a second timing that arrives at shorter intervals than the first timing. In the present embodiment, the second timing arrives in a second cycle shorter than the first cycle.

Figure 5:
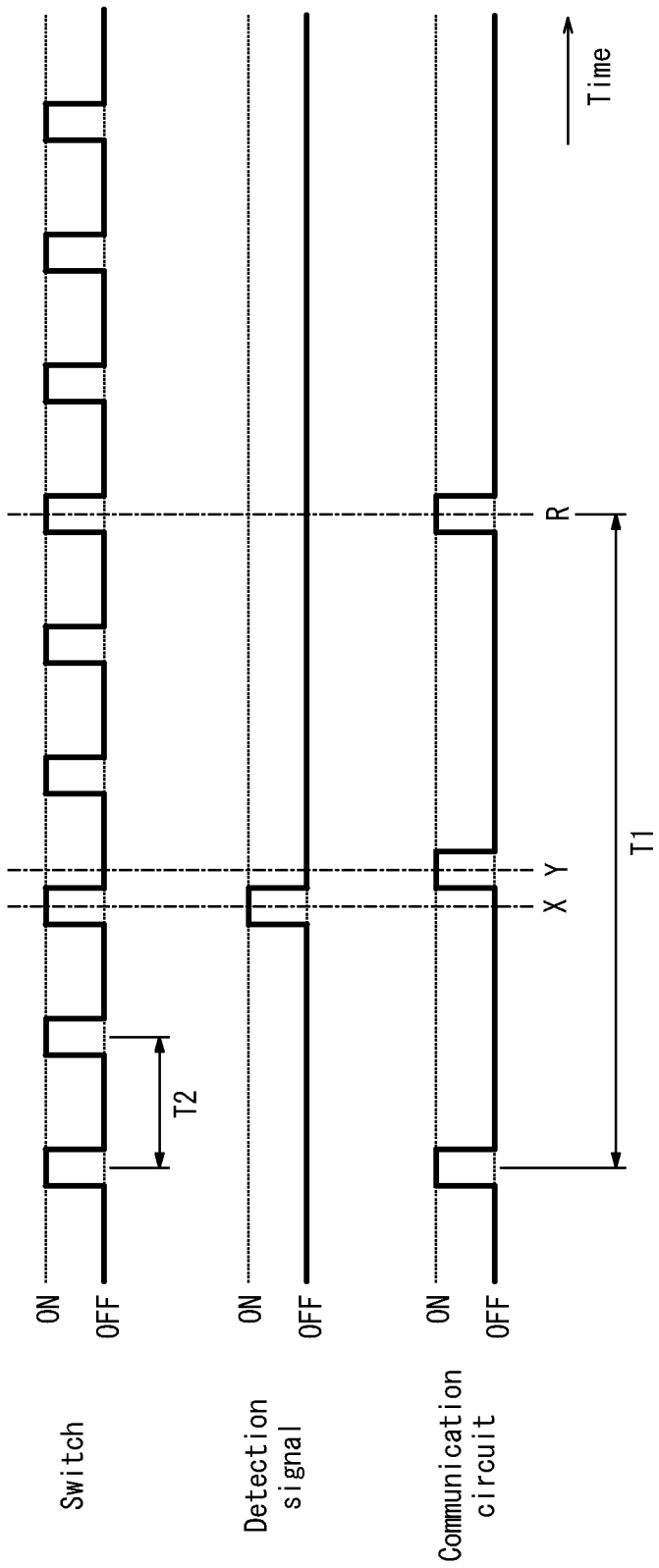
FIG. 5 is a diagram illustrating the timing of operation of the state detection apparatus according to an embodiment.

The operating condition of the communication circuit 16 and the state of the switch 14 are illustrated as a timing chart in FIG. 5 for the case in which the control circuit 12 controls the communication circuit 16 and the switch 14 at the first and second timings. In FIG. 5, the horizontal axis represents the passage of time. In the row for the switch 14, two dashed lines corresponding to the state of the switch 14 being "ON" or "OFF" are depicted. The solid line superimposed on the dashed lines represents which of the two states, "ON" or "OFF", the state of the switch 14 changes to as time passes. In the period in which the solid line is superimposed on the dashed line on the "ON" side, the switch 14 is closed. In the period in which the solid line is superimposed on the dashed line on the "OFF" side, the switch 14 is open. The second cycle over which the control circuit 12 controls the state of the switch 14 to be "ON" is represented by T2.

In the row for the communication circuit 16, two dashed lines corresponding to the operating condition of the communication circuit 16 being "ON" or "OFF" are depicted. The solid line superimposed on the dashed lines represents which of the two operating conditions, "ON" or "OFF", the operating condition of the communication circuit 16 changes to as time passes. In the period in which the solid line is superimposed on the dashed line on the "ON" side, the communication circuit 16 is operating. In the period in which the solid line is superimposed on the dashed line on the "OFF" side, the communication circuit 16 is not operating. The first cycle over which the control circuit 12 operates the communication circuit 16 is represented by T1.

As described above, the control circuit 12 inputs the test signal, generated by the voltage outputted by the battery 11 due to the switch 14 being closed, to the signal converter 20. The signal converter 20 applies the voltage of the test signal to the contact circuit 30 via the explosion-proof barrier 24. When the state of the device connected to the contact circuit 30 is abnormal, the application of the test signal to the contact circuit 30 causes a current to flow in the contact circuit 30. In the case of detecting that a current has flowed in the contact circuit 30, the explosion-proof barrier 24 outputs a detection signal. The control circuit 12 acquires the detection signal from the explosion-proof barrier 24 of the signal converter 20. The control circuit 12 can check the state of the device connected to the contact circuit 30 based on the acquired detection signal. An example of a detection signal is illustrated in the timing chart in FIG. 5. In the row for the detection signal, two dashed lines corresponding to the state of the detection signal being "ON" or "OFF" are depicted. The solid line superimposed on the dashed lines represents which of the two states, "ON" or "OFF", the detection signal changes to as time passes. In the period in which the solid line is superimposed on the dashed line on the "ON" side, the explosion-proof barrier 24 is outputting the detection signal. In the period in which the solid line is superimposed on the dashed line on the "OFF" side, the explosion-proof barrier 24 is not outputting the detection signal.

Here, in the timing chart of FIG. 5, the control circuit 12 detects that the state of the detection signal is "ON", i.e., that the detection signal has been outputted from the explosion-proof barrier 24, at the timing represented as X by a vertical dashed dotted line. Based on the state of the detection signal having changed to "ON", the control circuit 12 determines that the state of the device connected to the contact circuit 30 is abnormal. After determining that the state of the device connected to the contact circuit 30 is abnormal, the control circuit 12 operates the communication circuit 16 at a special timing represented as Y by a vertical dashed dotted line, without waiting until the arrival of the next first timing represented as R by a vertical dashed dotted line, to transmit to the external apparatus, using the communication circuit 16, an indication that the state of the device connected to the contact circuit 30 is abnormal.

As a result of the control circuit 12 operating the communication circuit 16 at the special timing (Y) after acquiring the detection signal, the time taken from when the control circuit 12 detects the abnormal state of the contact circuit 30 until the control circuit 12 transmits the detection of the abnormal state to the external apparatus is shortened, regardless of the timing of the detection of the abnormal state of the contact circuit 30.

As described above, in the state detection apparatus 1 of the present embodiment, the control circuit 12 operates the communication circuit 16 at the first timing and operates the communication circuit 16 at a special timing when a detection signal is acquired. With this configuration, the time taken from when the control circuit 12 detects the abnormal state of the contact circuit 30 until the control circuit 12 transmits the detection of the abnormal state to the external apparatus is shortened, regardless of the timing of the detection of the abnormal state of the contact circuit 30. Furthermore, the time taken from when the control circuit 12 detects the abnormal state of the contact circuit 30 until the control circuit 12 transmits the detection of the abnormal state to the external apparatus is shortened without shortening the interval of the first timing for operating the communication circuit 16. By the interval of the first timing for operating the communication circuit 16 not being shortened, the power consumption of the communication circuit 16 is reduced. As a result, both the shortening of the time taken from the detection of the abnormal state of the contact circuit 30 by the control circuit 12 to the transmission of the information indicating detection of the abnormal state and the reduction in power consumption of the communication circuit 16 are achieved.

In addition, by including the explosion-proof barrier 15 or 24, the state detection apparatus 1 can be used as equipment with an intrinsically safe explosion-proof structure to monitor the state of the device connected to the contact circuit 30.

The state detection apparatus 1 also includes the explosion-proof barrier 24 between the signal converter 20, which includes the step-up circuit 21, and the contact circuit 30. The step-up signal is therefore not inputted to the transmitter 10 even when the voltage of the detection signal is lower than the voltage of the step-up signal.

The state detection apparatus 1 also includes the step-up circuit 21 in the signal converter 20, so that even if the power outputted from the transmitter 10 is limited by the explosion-proof barrier 15, the voltage inputted to the contact circuit 30 can be sufficiently stepped up to detect the state of the device connected to the contact circuit 30.

OTHER EMBODIMENTS

The transmitter 10 of the state detection apparatus 1 need not include the latch circuit 17. In this case, the control circuit 12 acquires the detection signal from the explosion-proof barrier 24 of the signal converter 20 when the detection signal is inputted. The control circuit 12 may operate the communication circuit 16 upon acquiring the detection signal. By the transmitter 10 not including the latch circuit 17, a reduction in the size or cost of the circuitry for the transmitter 10 can be achieved. Upon acquiring the detection signal, the control circuit 12 may execute a process to operate the communication circuit 16 as an interrupt process and transmit the detection of an abnormal state of the contact circuit 30 to the external apparatus.

As a result of the state detection apparatus 1 including the latch circuit 17 on the line that inputs the detection signal from the signal converter 20 to the control circuit 12, the control circuit 12 can acquire the detection signal at a timing determined by the control circuit 12 itself. The control circuit 12 may set a third timing, which arrives at a shorter interval than the first timing, as the timing for acquiring the detection signal from the latch circuit 17. In the case in which the control circuit 12 operates the communication circuit 16 when the detection signal is inputted to the control circuit 12, the control circuit 12 needs to implement an interrupt process in response to input of the detection signal. The interrupt process may place a heavy load on the control circuit 12 and increase the circuit size of the control circuit 12. Therefore, the load on the control circuit 12 can be reduced by enabling the control circuit 12 to acquire the detection signal at a timing determined by the control circuit 12 itself.

The latch circuit 17 may be included in the control circuit 12. For example, the control circuit 12 may include a memory, such as a non-volatile memory, that holds the detection signal. In this way, a reduction in the size or cost of circuitry can be achieved.

The battery 11 may be a lithium thionyl chloride primary battery.

Lithium thionyl chloride primary batteries are characterized by high power capacity and low self-discharge, allowing these batteries to be used for an extended period of time. Therefore, lithium thionyl chloride primary batteries are sometimes incorporated into wireless measurement apparatuses used in the field, such as process plants and factories, where stable operation over an extended period of time is required.

During the use of a lithium thionyl chloride primary battery, a rise in internal resistance due to the formation of a chloride film inside the lithium thionyl chloride primary battery may become problematic when the load current flowing in the lithium thionyl chloride primary battery is small. Specifically, once the internal resistance of the lithium thionyl chloride primary battery has increased due to a prolonged period of low load current, an apparatus that operates on power from the lithium thionyl chloride primary battery may suddenly transition to high load operation. In this case, the current flowing in the lithium thionyl chloride primary battery suddenly increases. The increase in current in a state of increased internal resistance causes a sudden drop in output voltage. The drop in output voltage may cause the apparatus to stop or cause abnormal operation of the apparatus.

Therefore, an apparatus using a lithium thionyl chloride primary battery monitors the internal resistance of the lithium thionyl chloride primary battery, and in a case in which the internal resistance reaches a predetermined value or greater, the apparatus executes an operation to reduce the internal resistance. Specifically, in a case in which the internal resistance reaches a predetermined value or greater, the internal resistance is reduced by application of a current equal to or greater than a predetermined current to the lithium thionyl chloride primary battery. The predetermined current may be a current value determined based on the specifications of the lithium thionyl chloride primary battery.

In the case in which the battery 11 is a lithium thionyl chloride primary battery in the state detection apparatus 1 of the present embodiment, the control circuit 12 can reduce the internal resistance of the battery 11 by applying a current equal to or greater than the predetermined current. The transmitter 10 further includes a load circuit 13, as illustrated in FIG. 3, although this component is not essential. The load circuit 13 is configured to include a load such as electrical resistance. In the case in which the transmitter 10 includes the load circuit 13, the control circuit 12 may apply current to the load circuit 13 so as to apply a current equal to or greater than the predetermined current to the battery 11.

The control circuit 12 may output a signal to the contact circuit 30 in conjunction with performing the operation to reduce the internal resistance of the lithium thionyl chloride primary battery. In this case, the control circuit 12 may control the switch 14 to be closed so that a portion of the current flowing to the battery 11 flows to the signal converter 20. In other words, the first timing may be the timing at which the internal resistance of the battery 11 becomes a predetermined value or greater.

The signal converter 20 of the state detection apparatus 1 need not include the step-up circuit 21. In this case, the signal converter 20 inputs a voltage signal having the voltage outputted by the battery 11 as a test signal to the contact circuit 30.

The state detection apparatus 1 according to the present embodiment can be applied to devices that operate with small power consumption in a normal state and operate with greater power consumption than normal in an abnormal state.

In a case in which the state detection apparatus 1 does not include the signal converter 20, a test signal may be applied from the explosion-proof barrier 15 to the contact circuit 30. In this case, the explosion-proof barrier 15 includes a current detection circuit that detects the current flowing in the contact circuit 30. The explosion-proof barrier 15 detects the current flowing in the contact circuit 30 and outputs a detection signal to the control circuit 12 indicating that a current has flowed in the contact circuit 30. The current detection circuit of the explosion-proof barrier 15 may have a configuration that is the same as or similar to the configuration described for the current detection circuit of the explosion-proof barrier 24.

Although embodiments of the present disclosure have been described through drawings and examples, it is to be noted that various changes and modifications will be apparent to those skilled in the art on the basis of the present disclosure. Therefore, such changes and modifications are to be understood as included within the scope of the present disclosure. For example, the functions or the like included in the various components or steps may be reordered in any logically consistent way. Furthermore, components or steps may be combined into one or divided.

The invention claimed is:

1. A state detection apparatus comprising:
   a communication circuit configured to transmit information to an external apparatus;
   a control circuit configured to operate the communication circuit at a first timing;
   a battery configured to supply electric power to the communication circuit and the control circuit; and a first explosion-proof barrier connected between a contact circuit and the control circuit, wherein
the control circuit is configured to
apply a test signal, generated based on a voltage outputted by the battery, to the contact circuit via the first explosion-proof barrier at a second timing that arrives at a shorter interval than the first timing,
acquire, from the first explosion-proof barrier, a detection signal indicating that a current has flowed in the contact circuit due to application of the test signal to the contact circuit, and
regardless of the first timing, operate the communication circuit at a timing at which the detection signal is acquired to transmit to the external apparatus that the contact circuit is closed.

2. The state detection apparatus of claim 1, further comprising:
a latch circuit configured to acquire and hold the detection signal, wherein
the control circuit acquires the detection signal from the latch circuit.

3. The state detection apparatus of claim 2, wherein the control circuit acquires the detection signal from the latch circuit at a third timing that arrives at a shorter interval than the first timing.

4. The state detection apparatus of claim 1, wherein the control circuit operates the communication circuit as an interrupt process, upon acquiring the detection signal, to transmit to the external apparatus that the contact circuit is closed.

5. The state detection apparatus of claim 1, wherein the battery is a lithium thionyl chloride primary battery.

6. The state detection apparatus of claim 2, wherein the battery is a lithium thionyl chloride primary battery.

7. The state detection apparatus of claim 3, wherein the battery is a lithium thionyl chloride primary battery.

8. The state detection apparatus of claim 4, wherein the battery is a lithium thionyl chloride primary battery.

9. The state detection apparatus of claim 5, wherein at the second timing, the control circuit causes the battery to output a current equal to or greater than a current value based on specifications of the lithium thionyl chloride primary battery.

10. The state detection apparatus of claim 6, wherein at the second timing, the control circuit causes the battery to output a current equal to or greater than a current value based on specifications of the lithium thionyl chloride primary battery.

11. The state detection apparatus of claim 7, wherein at the second timing, the control circuit causes the battery to output a current equal to or greater than a current value based on specifications of the lithium thionyl chloride primary battery.

12. The state detection apparatus of claim 8, wherein at the second timing, the control circuit causes the battery to output a current equal to or greater than a current value based on specifications of the lithium thionyl chloride primary battery.

13. The state detection apparatus of claim 1, further comprising:
a step-up circuit connected between the first explosion-proof barrier and the contact circuit, and a second explosion-proof barrier connected between the step-up circuit and the contact circuit, wherein
the step-up circuit steps up a voltage outputted by the battery to generate a step-up signal and applies the step-up signal as the test signal to the contact circuit via the second explosion-proof barrier.

14. The state detection apparatus of claim 1, wherein a state of the contact circuit corresponds to a state of a device connected to the contact circuit.

* * * * *